(12) United States Patent
Kim

(10) Patent No.: US 9,070,680 B2
(45) Date of Patent: Jun. 30, 2015

(54) CHIP ON FILM TYPE SEMICONDUCTOR PACKAGE

(75) Inventor: Do-young Kim, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 470 days.

(21) Appl. No.: 13/404,085

(22) Filed: Feb. 24, 2012

(65) Prior Publication Data

US 2012/0273928 A1 Nov. 1, 2012

(30) Foreign Application Priority Data

Apr. 28, 2011 (KR) .................. 10-2011-0040319

(51) Int. Cl.
| | |
|---|---|
| *H01L 23/36* | (2006.01) |
| *H01L 23/498* | (2006.01) |
| *H01L 23/373* | (2006.01) |
| *H01L 23/522* | (2006.01) |
| *H01L 23/00* | (2006.01) |
| *H01L 21/56* | (2006.01) |

(52) U.S. Cl.
CPC ............ *H01L 23/4985* (2013.01); *H01L 23/36* (2013.01); *H01L 23/373* (2013.01); *H01L 23/522* (2013.01); *H01L 2224/831* (2013.01); *H01L 24/03* (2013.01); *H01L 24/05* (2013.01); *H01L 24/13* (2013.01); *H01L 24/16* (2013.01); *H01L 24/81* (2013.01); *H01L 2224/0345* (2013.01); *H01L 2224/0401* (2013.01); *H01L 2224/05166* (2013.01); *H01L 2224/05567* (2013.01); *H01L 2224/05644* (2013.01); *H01L 2224/05647* (2013.01); *H01L 2224/13144* (2013.01); *H01L 2224/13147* (2013.01); *H01L 2224/13155* (2013.01); *H01L 2224/16225* (2013.01); *H01L 2224/16238* (2013.01); *H01L 2224/32225* (2013.01); *H01L 2224/73204* (2013.01); *H01L 2224/81191* (2013.01); *H01L 21/563* (2013.01); *H01L 2924/00014* (2013.01)

(58) Field of Classification Search
USPC ................ 257/276, 625, 673, 675, 706, 707, 257/712–722, 796, 674, 668, 753, 783, 257/E23.012, E23.019, E23.034, E23.051, 257/E23.16, E21.514, E23.101; 438/111, 438/112, 122, 123, FOR. 366, FOR. 367, 438/FOR. 377, FOR. 380, FOR. 413
See application file for complete search history.

(56) References Cited

U.S. PATENT DOCUMENTS

| | | | | |
|---|---|---|---|---|
| 5,751,060 | A * | 5/1998 | Laine et al. .................... | 257/702 |
| 7,253,508 | B2 * | 8/2007 | Liu et al. ........................ | 257/678 |
| 7,443,038 | B2 * | 10/2008 | Kinsman ........................ | 257/778 |
| 8,283,774 | B2 * | 10/2012 | Kim .............................. | 257/706 |

(Continued)

FOREIGN PATENT DOCUMENTS

KR 10-0771890 B1 11/2007

*Primary Examiner* — Jasmine Clark
(74) *Attorney, Agent, or Firm* — NSIP Law

(57) ABSTRACT

A chip on film (COF) type semiconductor package is provided. The chip on film (COF) type semiconductor package includes a film, a plurality of leads formed on a surface of the film, a chip adhered to ends of the leads, an underfill layer filled within a space between the chip and the leads, and a heat dissipation layer adhered to an other surface of the film, the heat dissipation layer including a graphite material layer, a protection layer formed on a surface of the graphite material layer to cover the graphite material layer, and an adhesion layer formed on an other surface of the graphite material layer to adhere the heat dissipation layer to the other surface of the film.

24 Claims, 3 Drawing Sheets

(56) References Cited

U.S. PATENT DOCUMENTS

2006/0209514 A1* 9/2006 Katoh .......................... 361/705
2010/0314637 A1* 12/2010 Kim et al. ...................... 257/88
2011/0304991 A1* 12/2011 Huang et al. .................. 361/719

* cited by examiner

CHIP ON FILM TYPE SEMICONDUCTOR PACKAGE

CROSS-REFERENCE TO RELATED APPLICATION

This application claims the benefit under 35 U.S.C. §119 (a) of Korean Patent Application No. 10-2011-0040319 filed on Apr. 28, 2011, in the Korean Intellectual Property Office, the entire disclosure of which is incorporated herein by reference for all purposes.

BACKGROUND

1. Field

The following description relates to a semiconductor package, and, for example, to a chip on film (COF) type semiconductor package in which a chip is attached on a film.

2. Description of Related Art

To expand the market area of display devices such as liquid crystal displays (LCDs), with promotion of low cost, large scale, and high performance, more pixels have to be integrated in a small area. Thus, as a lead pitch of a driver integrated circuit (IC) which controls each pixel becomes finer within the display device, various packaging methods have been developed.

Packaging methods mainly used in a display device field include a tape carrier packaging (TCP) method, a chip on glass (COG) packaging method, a chip on film (COF) packaging method, and the like. These methods are referred to as wireless methods. To promote reduction in fabrication cost and improvement in yield due to a fine pitch, the share of COF technology in the packaging market has gradually increased since the late 1990s.

The COF technology is a new type of package that has been developed on a display driver IC with the trend of light, thin, short, and miniaturized communication equipment. When a high-resolution display device is implemented using the COF technology, driving frequencies of a television and a monitor are increased from 60 Hz to 120 Hz and, thus, driving load of the driver IC is increased. Thereby, heat generated in the IC is a serious concern.

A method of reducing the heat is disclosed in Korea patent No. 10-0771890.

FIG. 1 is a view illustrating a COF type semiconductor package in the related art. Referring to FIG. 1, in the COF type semiconductor package, a driver IC chip 103, which is a driving chip for display, is attached on a flexible film 101 by an adhesion layer (not shown). A plurality of leads 102 is disposed on the film 101 separately from each other. The plurality of leads 102 is disposed such that internal ends of the leads 102 are concentrated in a central portion.

A driver IC chip 103 is adhered to on upper surfaces of the leads 102 of which portions of the ends are exposed and an underfill layer 107 is filled in surroundings of the leads 102 to which the driver IC chip 103 is attached to stably fix the driver IC chip 103 on the film 101. The reference numeral 106 denotes a bump.

On the other hand, a heat dissipation layer 104 is adhered on a lower surface of the film 101 by an adhesion layer (not shown). The heat dissipation layer 104 functions to transfer heat generated by an operation of the driver IC chip 103 downward through the underfill layer 107 and the lead 102 and to radiate the transferred heat to the outside. The heat dissipation layer 104 may be formed of metals such as aluminum (Al).

In the related art, the heat dissipation layer 104 formed of metals is thickly formed to a thickness of about 200 μm. In particular, when the metal heat dissipation layer is used, a separate insulation tape 105 has to be used. Therefore, it is difficult to reduce a thickness of the semiconductor package. Further, when the metal heat dissipation layer 104 becomes thick, the damage of the semiconductor package, such as lead breakage, occurs.

SUMMARY

In a general aspect, there is provided a chip on film (COF) type semiconductor package, including a film, a plurality of leads formed on a surface of the film, a chip adhered to ends of the leads, an underfill layer filled within a space between the chip and the leads, and a heat dissipation layer adhered to an other surface of the film, the heat dissipation layer including a graphite material layer, a protection layer formed on a surface of the graphite material layer to cover the graphite material layer, and an adhesion layer formed on an other surface of the graphite material layer to adhere the heat dissipation layer to the other surface of the film.

A general aspect of the semiconductor package may further provide that the protection layer includes one or more selected from the group consisting of polyethylene terephthalate, polybutylene terephthalate, polytrimethylene terephthalate, polycyclohexylene terephthalate, and polyethylene naphthalate.

A general aspect of the semiconductor package may further provide that a thickness of the protection layer is in a range from 10 μm to 40 μm.

A general aspect of the semiconductor package may further provide that a thickness of the graphite material layer is in a range from 20 μm to 60 μm.

A general aspect of the semiconductor package may further provide that the graphite material layer includes a graphite film, the graphite film including a polymer chain in which polymers are cross-linked with each other.

A general aspect of the semiconductor package may further provide that the graphite material layer includes a polymer chain in which polymers are cross-linked with each other.

A general aspect of the semiconductor package may further provide that the graphite film has a multi-layered structure in which a plurality of graphite thin films is laminated.

A general aspect of the semiconductor package may further provide that the graphite film has the multi-layered structure in which 100 to 300 graphite thin films are laminated.

A general aspect of the semiconductor package may further provide that the protection layer has an insulation property.

A general aspect of the semiconductor package may further provide that a thickness of the adhesion layer is in a range from 10 μm to 40 μm.

A general aspect of the semiconductor package may further provide that a thickness of the heat dissipation layer is in a range from 60 μm to 140 μm.

A general aspect of the semiconductor package may further provide that the chip includes a driver integrated circuit (IC) chip.

A general aspect of the semiconductor package may further provide that the film includes polyimide.

In another general aspect, there is provided a method of fabricating a graphite film of a graphite material layer of a heat dissipation layer of a chip on film (COF) type semiconductor package, the COF type semiconductor package including a film, a plurality of leads formed on a surface of the film, a chip adhered to ends of the leads, an underfill layer filled within a space between the chip and the leads, and the heat dissipation layer adhered to an other surface of the film, the heat dissipation layer including the graphite material layer, a protection layer formed on a surface of the graphite material layer to cover the graphite material layer, and an adhesion layer formed on an other surface of the graphite material layer to adhere the heat dissipation layer to the other surface of the film, the method including making a polymer film or a carbonized polymer film to be graphite.

A general aspect of the method may further provide that the polymer film or the carbonized polymer film includes polyimide.

Other features and aspects may be apparent from the following detailed description, the drawings, and the claims.

Figure 1:
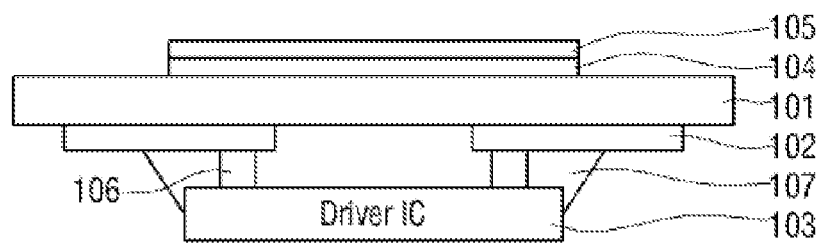
FIG. 1 is a view illustrating an example of a chip on film (COF) type semiconductor package in the related art.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the apparatuses and/or systems described herein. Accordingly, various changes, modifications, and equivalents of the systems and/or apparatuses described herein will be suggested to those of ordinary skill in the art. Also, descriptions of well-known functions and constructions may be omitted for increased clarity and conciseness.

It is understood that the features of the present disclosure may be embodied in different forms and should not be construed as limited to the examples set forth herein. Rather, examples are provided so that this disclosure will be thorough and complete, and will convey the full scope of the present disclosure to those skilled in the art. The drawings may not be necessarily to scale, and, in some instances, proportions may have been exaggerated in order to clearly illustrate features of the examples. When a first layer is referred to as being "on" a second layer or "on" a substrate, it may not only refer to a case where the first layer is formed directly on the second layer or the substrate but may also refer to a case where a third layer exists between the first layer and the second layer or the substrate.

Figure 2:
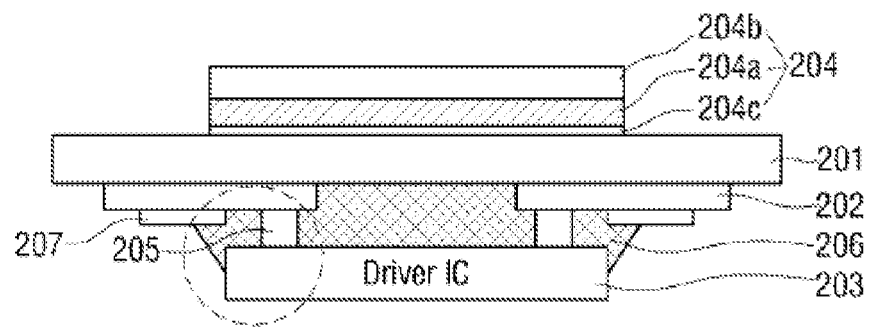
FIG. 2 is a view illustrating an example of a COF type semiconductor package according to a general aspect.

FIG. 2 is a schematic view illustrating an example of a chip on film (COF) type semiconductor device according to a general aspect. Referring to FIG. 2, the COF type semiconductor package includes a film 201, a plurality of leads 202 formed on one surface of the film 201, a driver integrated circuit (IC) chip 203 to drive a display, a plurality of bumps 205 bonding the corresponding leads 202 and the driver IC chip 203, and a heat dissipation layer 204 adhered to an other surface of the film 201. Here, the driver IC chip 203 may include one of a thin film transistor-liquid crystal display (TFT-LCD), a super twisted nematic (STN)-LCD, a ferroelectric (F)-LCD, a cholesteric (Ch)-LCD, a light emitting diode (LED), a plasma display panel (PDP), and an organic electroluminescence (EL) display. A chip including the driver IC chip 203 may be attached.

The film 201 is provided to form a driver IC chip 203 and includes an insulating layer (not shown). The film 201 may be formed of a material such as polyimide (PI) having flexibility. The leads 202 are formed of a material of copper (Cu). The film 201 and the leads 202 are formed in a two-layered structure in which Cu is plated on a PI film. The two-layered structure is suitable for high flexibility and a fine pitch. The Cu leads 202 formed on the film 201 may transfer electrical characteristics of the driver IC chip 203 to a panel that is an external output apparatus. The film 201 is formed to a thickness of 10 µm to 60 µm and the Cu leads 202 are formed to a thickness of 3 µm to 20 µm. A solder resist 207 may be deposited to protect the Cu leads 202. When the solder resist 207 is not deposited on the leads 202, Cu is intactly exposed and oxidized in an external air and, thus, resistance of the Cu leads 202 are increased. Further, tin (Sn) is coated on a Cu surface which cannot be protected by the solder resist 207.

The leads 202 and the driver IC chip 203 are bonded through the bumps 205 that correspond to the leads 202. The bumps 205 may be formed of a material such as gold (Au), Cu, nickel (Ni), or a combination thereof.

Figure 5:
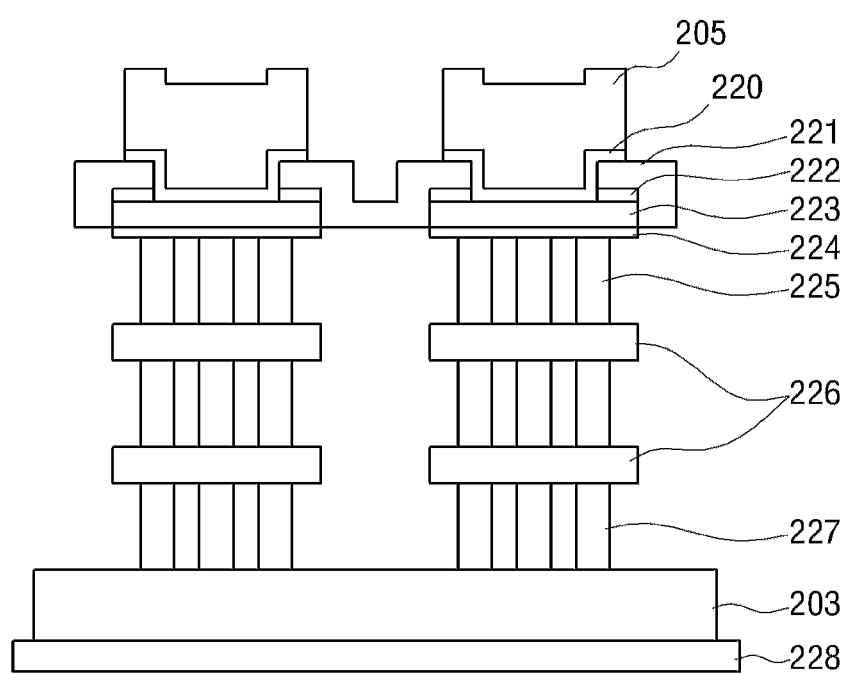
FIG. 5 is an expanded view of a circular portion of FIG. 2 illustrating an example of a COF type semiconductor package in which top metal pads are used according to a general aspect.

FIG. 5 is an expanded view of a circular portion of FIG. 2 illustrating an example of a COF type semiconductor package in which top metal pads 223 are used according to a general aspect. Referring to FIG. 5, top metal pads 223 connected to the driver IC chip 203 connect the driver IC chip 203 and the corresponding bumps 205. The top metal pads 223 are to be bonding pads. A semiconductor device serving as a driver IC is formed below the top metal pads 223, and top vias 225 may be formed between the driver IC chip 203 and the corresponding top metal pads 223. The semiconductor device serving as the driver IC may be formed below the pad or on a side of the pad. When the semiconductor device is formed below the pad, the whole area of the chip can be reduced.

The top metal pads 223 are exposed by passivation layers 221 used as protection layers. The protection layers are necessary to prevent moisture from penetrating into the chip. The passivation layer 221 is formed of a silicon nitride layer, a silicon oxide layer, or a combination thereof. As the top metal pads 223, any one selected from the group consisting of an aluminum (Al) metal, a Cu metal, and an alloy of Al—Cu may be used. When the Al metal is used as the top metal pads 223, corresponding barrier metals 224 may be formed under the Al metals 223, and a plurality of anti-reflective coating (ARC) layers 222 may be formed on the Al metals 223. Each of the metal barriers 224 and the ARC layers 222 may include titanium (Ti), titanium nitride (TiN), or titanium tungsten (TiW). As the barrier metals 224, the Al metals 223, and the ARC layers 222, any one selected from the group consisting of Ti/Al/TiN, Ti/TiN/Al/TiN, Ti/TiN/Al/Ti/TiN, TiN/Al/TiN, Ti/Al/TiW, and Ti/TiN/Al/TiW may be used. Among these, the structure of Ti/Al/TiN or Ti/TiN/Al/TiN is an effective example that may be used to prevent cracks and radiate heat. In the general aspect, the structure of Ti/TiN/Al/TiN may be used.

Before the bumps 205 are formed, under bump metallization (UBM) layers 220 corresponding to the bumps 205 are formed to reinforce adhesion force between the bumps 205 and the corresponding top metal pads 223. The UBM layers 220 may be formed of TiW and Au. Au seed layers (not illustrated) may be additionally formed on the TiW layers 220. The Au seed layers serve as corresponding seed layers of Au bumps 205. When Cu bumps 205 are used, a Cu seed layers (not illustrated) may be formed in place of the Au seed layers. The TiW layers 220 and the Au seed layers may be deposited by a sputtering method.

As seen from FIG. 5, the TiN layers used as the ARC layers 222 are removed between the Al pads 223 and the corresponding bumps 205 in contact with the Al pads 223. Then, TiN/Au layers as the UBM layers 220 are deposited in a portion in which the TiN layers used as the ARC layers 222 are removed between the Al pads 223 and the corresponding bumps 205. This is because the remaining TiN layers used as the ARC layers 222 between the Al pads 223 and the corresponding bumps 205 degrade an adhesion force therebetween. The TiN layers as the ARC layers 222 under the passivation layers 221 remain.

Under metal layers 226 and connection plugs 227 may be additionally formed to electrically connect the driver IC chip 203 formed on a silicon (Si) substrate 228 with the top metal pads 223. Although not shown, in the driver IC chip 203, a well, a gate insulating layer, a gate, a source and a drain, and a field oxide layer, such as a shallow trench isolation (STI) and a deep trench isolation (DTI), may be formed.

Materials used in the bumps 205 and the corresponding UBM layers 220 may be adjusted to maximize a heat dissipation effect by a graphite material layer that is to be formed. For example, a structure of TiW/Au seed layer/Au bump, a structure of TiW/Cu seed layer/Cu bump, a structure of TiW/Au seed layer/Cu bump, or a structure of TiW/Cu seed layer/Au bump, which is formed on an Al pad surface, may be suitable to maximize the heat dissipation effect. Moreover, since an Au material or a Cu material used as the bumps 205 and the coating material for the corresponding UBM layers 220 has good thermal conductivity, when the graphite material layer is included, heat dissipation for the heat generated in the driver IC chip 203 may be greater.

As a further example, in a general aspect, a structure of Ti/TiN/Al/TiW/Au bump/Polyimide/graphite heat dissipation layer or a structure of Ti/TiN/Al/TiW/Cu bump/Polyimide/graphite heat dissipation layer may be used to maximize the heat dissipation effect to the driver IC chip 203.

Referring again to FIG. 2, the driver IC chip 203 is attached on an upper surface of the leads 202 and an underfill layer 206 is filled around the leads 202 to which the driver IC chip 203 is attached to stably fix the driver IC chip 203 on the film 201. That is, the underfill layer 206 is filled within a space between the driver IC chip 203 and the leads 202. As the underfill layer 206, for example, a liquid resin may be used.

The heat dissipation layer 204 is attached on a lower surface of the film 201 through an adhesion layer 204c of the heat dissipation layer 204. The heat dissipation layer 204 functions to transfer heat generated by an operation of the driver IC chip 203 downward through the underfill layer 206 and the leads 202 and then radiate the heat to the outside. In a general aspect, the heat dissipation layer 204 includes a graphite material layer 204a, a protection layer 204b, and the adhesion layer 204c.

The graphite material layer 204a includes graphite as a material. The graphite may be obtained by a process of grinding coke, which is a raw material of graphite, into a powder of varying thickness, a process of adding a binder to the grinded cokes, a process of forming the grinded cokes to which the binder is added, a process of carbonizing the formed cokes by heating at a temperature of about 1,000° C. to form a carbon block, and a process of heating the carbonized carbon block to a temperature of 3,000° C. to reduce a size and a volume thereof.

Alternatively, a graphite film may be fabricated by using a polymer film or a carbonized polymer film as a raw material. The method includes a process of carbonizing the polymer film at a temperature of 600° C. to 1,800° C. and a process of making the carbonized polymer film to be graphite at a temperature of about 2,000° C. to 3,000° C. Therefore, a pure carbon ingredient from which an impurity is removed is left through the graphite process. The polymer film may include a rayon-based polymer, a pitch-based polymer, a polyacrylonitrile (PAN)-based polymer, PI, polyamide (PA), a polyvinylidene chloride-based fiber, a poly perfluoroalcohol-based fiber, a phenol-based fiber, or a combination of two or more thereof. The polymer film may include a PI-based polymer film. The PI film has a property to obtain a film having various structures and characteristics by selecting a desired raw material monomer.

Figure 3:
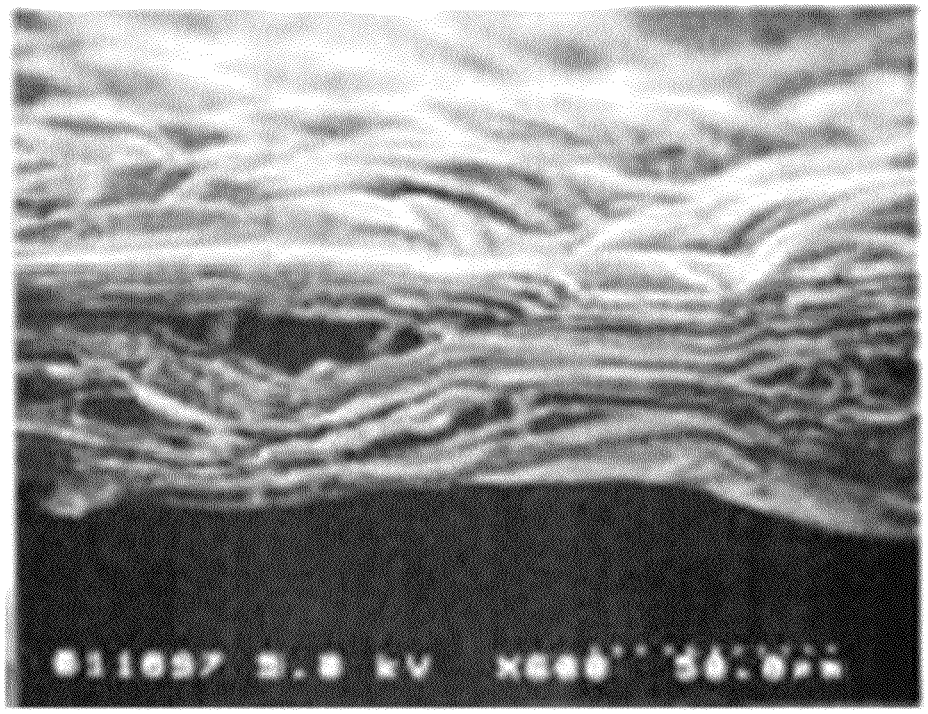
FIG. 3 is a scanning electron microscope (SEM) photograph illustrating an example of a cross-section of a graphite sheet according to a general aspect.
Figure 4:
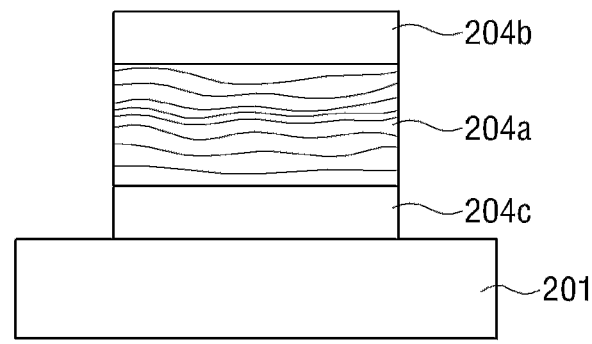
FIG. 4 is an expanded view illustrating an example of a heat dissipation layer according to a general aspect.

FIG. 3 is a scanning electron microscope (SEM) photograph illustrating a cross-section of a graphite film obtained using a carbonized polymer film. Referring to FIG. 3, the graphite obtained by using the carbonized polymer film as a raw material has a polymer chain in which polymers are cross-linked with each other. Alternatively, the graphite film may be formed by laminating the graphite thin films of 100 to 300 layers (see FIGS. 3 and 4). Flexibility or elasticity can be formed due to a laminating effect. The graphite material layer 204a has a thickness of 20 μm to 60 μm to maximize a heat reduction effect. Furthermore, the graphite material layer 204a may have a thickness of 25 μm to 40 μm.

When viewed in cross-section referring to FIG. 3, several graphite fine films are laminated. Surfaces of the graphite thin films are not flat but uneven. Therefore, as seen from the SEM photograph, there may be spaces between the graphite thin films and the spaces give flexibility to the graphite film. The graphite thin films are laminated in a horizontal direction with respect to the film 201 and thus the heat generated in a LDC driver chip is rapidly diffused and dispersed to a horizontal or a planar direction. In addition, since the carbonized polymer film is used as a raw material and, thus, a polymer chain is cross-linked with each other to a vertical direction and a horizontal direction, the graphite film has a fixed elasticity, which is a unique property of a polymer.

The heat dissipation layer 204 includes the protection layer 204b. The protection layer 204b serves as an insulating layer and a protection layer that prevents exposure of the graphite material layer 204a to the outside, that is, a protection layer 204b to cover the graphite material layer 204a. For example, the protection layer 204b may prevent scratches and/or particles thereon from being caused. When there is no protection layer 204b, the graphite material layer 204a is exposed to the outside and, thus, scratches may be caused thereon and conductive particles of graphite may be attacked to a semiconductor chip (a LCD driver IC hip) or a substrate. In this case, a short circuit and the like may be caused. Therefore, the protection layer 204b may be formed on the graphite material layer 204a to maximize an insulation effect, prevention of occurrence of conductive foreign substances, and a heat dissipation effect.

The protection layer 204b may include a polyester-based resin having an insulation property to perform a function of an insulating layer. The polyester-based resin may be selected from the group consisting of polyethylene terephthalate (PET), polybutylene terephthalate (PBT), polytrimethylene terephthalate (PTT), polycyclohexylene terephthalate (PCT), and polyethylene naphthalate (PEN), but it is not limited thereto.

To maximize an insulation effect, prevention of occurrence of conductive foreign substances, and a heat dissipation effect of the protection layer 204b, a thickness of the protection layer 204b is 10 µm to 40 µm. The thickness of the protection layer 204b may be 30 µm. When the thickness of the protection layer 204b is less than 10 µm or greater than 40 µm, it is possible to suppress exhibition of good thermal conductivity of the graphite material layer 204a and cause the graphite material layer 204a to be degraded in adhesion and reliability.

The adhesion layer 204c may include a pressure sensitive adhesive (PSA). The adhesion layer 204c may be an adhesive containing conductive particles. For example, the adhesion layer 204c may include an acryl-based adhesive, PI, PET, or a double-sided tape. In a general aspect, the thickness of the adhesion layer 204c may be 10 µm to 40 µm to maximize the whole heat dissipation effect and obtain good adhesion. When the thickness of the adhesion layer 204c is between 10 µm to 40 µm, the protection layer 204b may further have good thermal conductivity. Moreover, the thickness of the protection layer 204b may be greater than 10 µm and equal to or less than 20 µm, or, for example, greater than 10 µm and equal to or less than 15 µm. When the thickness of the adhesion layer 204c is less than 10 µm, or greater than 40 µm, the adhesion and reliability of the heat dissipation layer 204 can be degraded.

In a general aspect, the heat dissipation layer 204 may be constituted of a graphite material layer/PET/an adhesion layer, or a graphite material layer/PEN/an adhesion layer. The heat dissipation layer 204 has good thermal conductivity, a heat dissipation effect, and reliability with a combination of a heat dissipation effect by the graphite material layer 204a having conductivity and thermal reduction efficiency with prevention of conductive foreign substances and a protection effect by PET or PEN of the protection layer 204b, compared to the heat dissipation layer in the related art.

In a general aspect, the heat dissipation layer 204 has a thickness of 60 µm to 140 µm, or, for example, a thickness of 65 µm to 80 µm. When the heat dissipation layer 204 is formed of metals, the thickness of the heat dissipation layer 204 should be greater than about 200 µm. However, in a general aspect, since the heat dissipation layer 204 includes a graphite material layer 204a, the heat dissipation layer 204 may have a lesser thickness of about 40 µm to 140 µm than the metal-based heat dissipation layer. Further, the heat dissipation layer 204 has a good heat dissipation effect.

The graphite film included in the graphite material layer 204a may give good flexibility to the heat dissipation layer 204 due to an inter-layer space between the graphite fine films. Therefore, the graphite film may be supplied to laminating equipment in a roll type without separate modification. That is, it may be possible to adhere the heat dissipation layer 204 on the film easily by performing a laminating process in a reel to reel.

The heat dissipation layer 204 including a graphite material layer 204a has a good tensile force and thus it may be possible to widely apply the heat dissipation layer to a tensible and flexible type product family, which cannot be implemented, by the metal heat dissipation layer.

For example, the heat dissipation layer 204 may be used for heat dissipation of electronic parts for vehicles, an LED, a fluorescent lamp, and the like and applied to products on which a heat sink cannot be mounted due to a thin film type of a driver IC chip, a temperature controller, a central processing unit, a memory, and other electronic products. The heat dissipation layer 204 may be used for a heat dissipation layer requiring an insulation property to a flexible printed circuit board (FPCB) and applied to a heat sink for the driver IC, various semiconductor product homilies, heat blocks, and the like.

Since the graphite heat dissipation layer in which a plurality of graphite films of a fine film type is laminated is hydrophobic, the graphite heat dissipation layer may not absorb water. In a general aspect, the graphite material layer 204a, the protection layer 204b, and the adhesion layer 204c are disposed in a row. For example, the graphite material layer 204a, the protection layer 204b, and the adhesion layer 204c may be disposed in a row for ease of fabrication. Both ends of the protection layer 204b and the adhesion layer 204c are formed to have a greater length than that of the graphite material layer 204a, so that both ends of the protection layer 204b and the adhesion layer 204c are met and the graphite material layer 204a is disposed therein (see FIG. 6). That is, ends of the graphite material layer 204a are surrounded by the protection layer 204b and the adhesion layer 204c to prevent exposure of the graphite material layer 204a to the outside. Alternatively, the protection layer 204b and the adhesion layer 204c may be positioned over or surrounding at least a portion of the ends of the graphite material layer 204a. Thereby, it may be possible to reduce the phenomenon in which the graphite material layer 204a is peeled off, lifted, or detached due to external shock. The heat dissipation layer 204 according to a general aspect may be rectangular-shaped or rectangular-shaped with rounded corners.

For example, a semiconductor package (comparative example) including an Al heat dissipation layer and semiconductor packages including a heat dissipation layer having a graphite material layer (embodiments 1 and 2) were fabricated and thermal conductivities and heat reduction efficiencies for each semiconductor package were measured and listed in Table 1. Here, an initial temperature and a final temperature are temperatures measured on the film 201. That is, the temperatures were measured on the Pl. Here, the heat reduction efficiency is a variation rate with respect to a difference between the initial temperature and the final temperature based on the initial temperature.

TABLE 1

|  | Comparative example | Embodiment 1 | Embodiment 2 |
| --- | --- | --- | --- |
| Material of heat dissipation layer | Al | Graphite | Graphite |
| Thicknesses of adhesion layer, material layer, protection layer (µm) | 50/120/30 | 10/25/30 | 10/40/30 |
| Total thickness (µm) | 200 | 65 | 80 |
| Thermal conductivity (W/mk) | 4.5 | 5.0 | 5.1 |
| Heat reduction efficiency (%) | 24 | 34 | 38 |

It is confirmed from Table 1 that the heat dissipation layers in embodiments 1 and 2 have good thermal conductivity and heat reduction efficiency, as well as a lesser thickness compared to the comparative example. When the thickness of the heat dissipation layer becomes from 25 µm to 40 µm, the heat reduction efficiency is increased from 34% to 38%.

According to the teachings above, there is provided a COF type semiconductor package having a heat dissipation layer having two or more graphite material layers. The heat dissipation layer may be used to obtain high heat dissipation efficiency with a combination of a heat dissipation effect by the graphite material layers, which have good conductivity, and high heat reduction efficiency with prevention of occurrence of conductive foreign substances and protection of the graphite material layers, with a thickness of the heat dissipation layer being less than that of the related art. In addition, the heat dissipation layer according to a general aspect may have good flexibility and may be widely applied to various fields compared to an Al heat dissipation layer.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A chip on film (COF) type semiconductor package, comprising:
    a film;
    a plurality of leads formed on a surface of the film;
    a chip adhered to ends of the leads;
    an underfill layer filled within a space between the chip and the leads; and
    a heat dissipation layer adhered to an other surface of the film, the heat dissipation layer comprising:
        a graphite material layer comprising a graphite film that has a multi-layered structure in which a plurality of graphite thin films is laminated;
        a protection layer formed on a surface of the graphite material layer to cover the graphite material layer; and
        an adhesion layer formed on an other surface of the graphite material layer to adhere the heat dissipation layer to the other surface of the film.

2. The semiconductor package as claimed in claim 1, wherein the protection layer comprises one or more selected from the group consisting of polyethylene terephthalate, polybutylene terephthalate, polytrimethylene terephthalate, polycyclohexylene terephthalate, and polyethylene naphthalate.

3. The semiconductor package as claimed in claim 1, wherein a thickness of the protection layer is in a range from 10 µm to 40 µm.

4. The semiconductor package as claimed in claim 1, wherein a thickness of the graphite material layer is in a range from 20 µm to 60 µm.

5. The semiconductor package as claimed in claim 1, wherein the the graphite film is obtained from a polymer or a carbonized polymer.

6. The semiconductor package as claimed as in claim 5, wherein the polymer or the carbonized polymer is cross-linked.

7. The semiconductor package as claimed in claim 5, wherein a thickness of the graphite material layer is in a range from 20 µm to 60 µm.

8. The semiconductor package as claimed in claim 1, wherein the graphite film comprises 100 to 300 graphite thin films.

9. The semiconductor package as claimed in claim 8, wherein a thickness of the graphite material layer is in a range from 20 µm to 60 µm.

10. The semiconductor package as claimed in claim 1, wherein the protection layer has an insulation property.

11. The semiconductor package as claimed in claim 10, wherein the protection layer comprises one or more selected from the group consisting of polyethylene terephthalate, polybutylene terephthalate, polytrimethylene terephthalate, polycyclohexylene terephthalate, and polyethylene naphthalate.

12. The semiconductor package as claimed in claim 10, wherein a thickness of the protection layer is in a range from 10 µm to 40 µm.

13. The semiconductor package as claimed in claim 1, wherein a thickness of the adhesion layer is in a range from 10 µm to 40 µm.

14. The semiconductor package as claimed in claim 1, wherein a thickness of the heat dissipation layer is in a range from 60 µm to 140 µm.

15. The semiconductor package as claimed as in claim 1, wherein the chip comprises a driver integrated circuit (IC) chip.

16. The semiconductor package as claimed as in claim 1, wherein the film comprises polyimide.

17. The semiconductor package as claimed in claim 1, wherein the adhesive layer comprises conductive particles.

18. The semiconductor package as claimed in claim 1, wherein the protection layer covers only the graphite material layer.

19. A method of fabricating a graphite film of a graphite material layer of a heat dissipation layer of a chip on film (COF) type semiconductor package, the COF type semiconductor package including a film, a plurality of leads formed on a surface of the film, a chip adhered to ends of the leads, an underfill layer filled within a space between the chip and the leads, and the heat dissipation layer adhered to an other surface of the film, the heat dissipation layer including the graphite material layer, a protection layer formed on a surface of the graphite material layer to cover the graphite material layer, and an adhesion layer formed on an other surface of the graphite material layer to adhere the heat dissipation layer to the other surface of the film, the method comprising making a graphite material layer comprising a graphite film layer that has a multi-layered structure in which a plurality of graphite thin films is laminated.

20. The method as claimed in claim 19, wherein the graphite film is obtained from a polymer film or a carbonized polymer film comprising polyimide.

21. A chip on film (COF) type semiconductor package, comprising:
    a film;
    a chip adhered to the film;
    an adhesion layer formed on the film;
    a heat dissipation layer formed over the adhesion layer; and
    a protection layer formed on a surface of the heat dissipation wherein the protection layer has a thickness of from 10 µm to 40 µm.

22. The semiconductor package as claimed in claim 21, wherein the adhesive layer comprises conductive particles.

23. The semiconductor package as claimed in claim 21, wherein the protection layer covers only the heat dissipation layer.

24. The semiconductor package as claimed in claim 21, wherein the heat dissipation layer comprises a graphite film obtained from a polymer or a carbonized polymer.

* * * * *